(12) United States Patent
Yang

(10) Patent No.: US 8,159,881 B2
(45) Date of Patent: Apr. 17, 2012

(54) REFERENCE VOLTAGE OPTIMIZATION FOR FLASH MEMORY

(75) Inventor: Xueshi Yang, Cupertino, CA (US)

(73) Assignee: Marvell World Trade Ltd., St. Michael (BB)

(*) Notice: Subject to any disclaimer, the term of this patent is extended or adjusted under 35 U.S.C. 154(b) by 113 days.

(21) Appl. No.: 12/791,430

(22) Filed: Jun. 1, 2010

(65) Prior Publication Data

US 2010/0309726 A1    Dec. 9, 2010

Related U.S. Application Data

(60) Provisional application No. 61/183,859, filed on Jun. 3, 2009.

(51) Int. Cl.
*G11C 11/34* (2006.01)
(52) U.S. Cl. .......... 365/185.18; 365/185.25; 365/189.09
(58) Field of Classification Search ............. 365/185.18, 365/185.25, 189.09
See application file for complete search history.

(56) References Cited

U.S. PATENT DOCUMENTS

| | | | |
|---|---|---|---|
| 7,372,739 B2 * | 5/2008 | Macerola | 365/185.25 |
| 2003/0169621 A1 | 9/2003 | Kawamura | |
| 2007/0159891 A1 | 7/2007 | Tu et al. | |

OTHER PUBLICATIONS

International Search Report and Written Opinion for corresponding International Application No. PCT/US2010/037155, 8 pages.

* cited by examiner

*Primary Examiner* — Jason Lappas

(57) ABSTRACT

A system includes a voltage generator and a reference voltage setting module. The voltage generator is configured to generate K voltages to be applied to memory cells. The K voltages are used to determine a reference voltage used to read the memory cells, where K is an integer greater than 1. The reference voltage setting module is configured to selectively set the reference voltage to a value between two adjacent ones of the K voltages or one of the two adjacent ones of the K voltages.

16 Claims, 10 Drawing Sheets

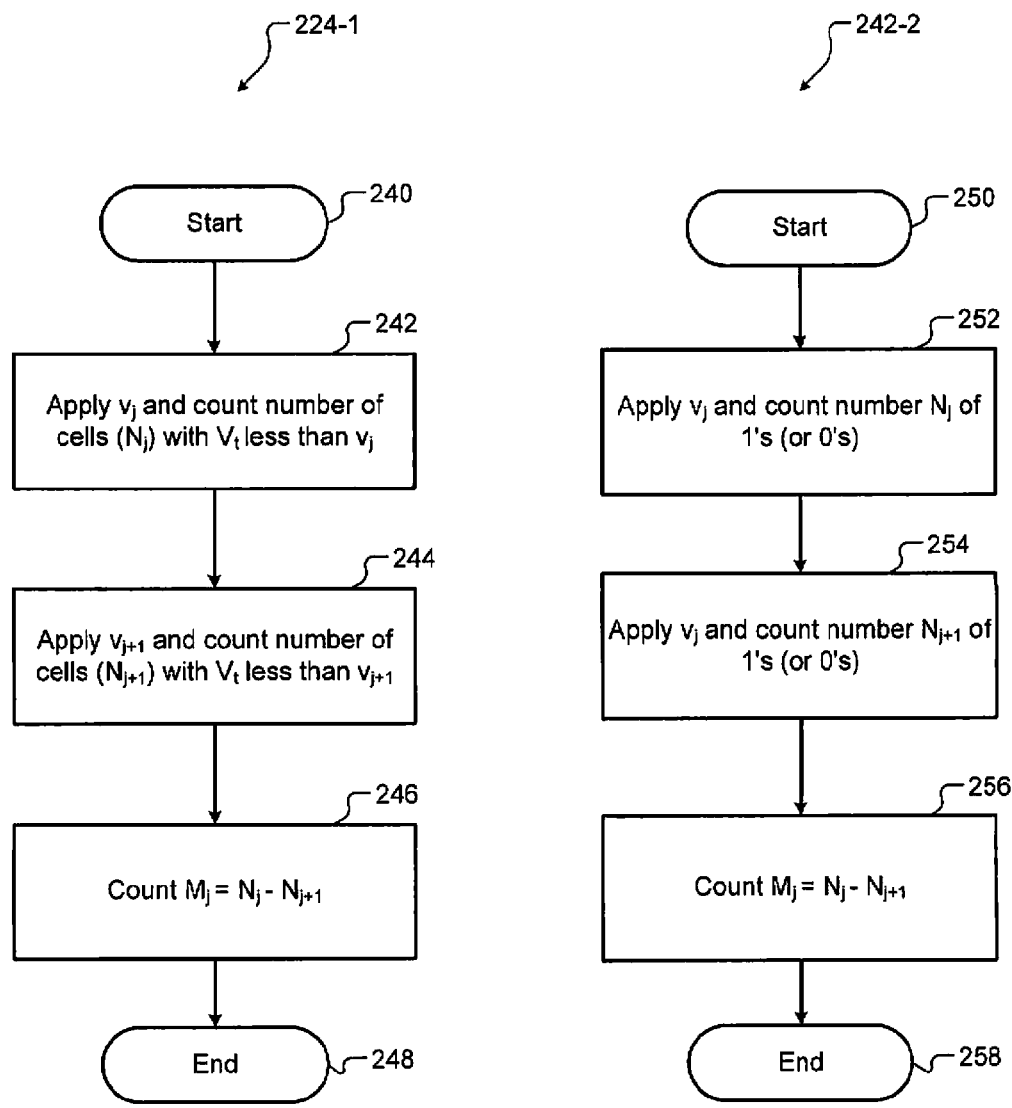
FIG. 6C  FIG. 6D

REFERENCE VOLTAGE OPTIMIZATION FOR FLASH MEMORY

CROSS-REFERENCE TO RELATED APPLICATIONS

This application claims the benefit of U.S. Provisional Application No. 61/183,859, filed on Jun. 3, 2009. The disclosure of the above application is incorporated herein by reference in its entirety.

FIELD

The present disclosure relates to semiconductor memory and more particularly to flash memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells may include cells of volatile or nonvolatile memory. Volatile memory loses data stored in the memory cells when power is removed from the memory cells. Nonvolatile memory retains data stored in the memory cells when power is removed from the memory cells.

The memory cells in the rows and columns of a memory array are addressed by word lines (WLs) that select the rows and bit lines (BLs) that select the columns. The memory ICs comprise WL and BL decoders that select the WLs and BLs, respectively, during read/write (R/W) and erase/program (EP) operations.

Referring now to FIG. 1, a memory IC 10 comprises a memory array 12, a WL decoder 16, a BL decoder 18, and a control module 19. The memory array 12 comprises memory cells 14 arranged in rows and columns as shown. The WL and BL decoders 16, 18 select the WLs and BLs, respectively, depending on the addresses of the memory cells 14 selected during R/W and EP operations.

The control module 19 receives commands (e.g., read, write, erase, program, etc.) from a host (not shown). The control module 19 reads and writes data in the selected memory cells 14. Additionally, the control module 19 erases and programs the selected memory cells 14 (e.g., in one or more blocks or pages) when the memory cells 14 include cells of nonvolatile memory such as flash memory.

For example only, the memory cells 14 may include cells of NAND or NOR flash memory. Each memory cell 14 may be programmed to store N binary digits (bits) of information, where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively.

Referring now to FIG. 2, a memory cell 14-$i$ may comprise a transistor 50 having a threshold voltage $V_T$. The transistor 50 may comprise a floating gate G (hereinafter gate G), a source S, and a drain D. The amount of charge stored in the gate G during a write operation determines the value of threshold voltage $V_T$ and the state of the memory cell 14-$i$.

For example only, the transistor 50 may have two programmable threshold voltages $V_{T1}$ and $V_{T2}$ depending on the amount of charge stored in the gate G. When the amount of charge stored in the gate G is Q1, the threshold voltage of the transistor 50 is $V_{T1}$. When the amount of charge stored in the gate G is Q2, the threshold voltage of the transistor 50 is $V_{T2}$. Depending on the amount charge stored in the gate G, a gate voltage (i.e., $V_{GS}$) having a value greater than or equal to $V_{T1}$ or $V_{T2}$ may turn on the transistor 50 (i.e., generate a predetermined drain current).

The state of the memory cell 14 (i.e., data stored in the memory cell 14) is read by measuring the threshold voltage $V_T$ of the transistor 50. The threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). Conversely, when the gate voltage is greater than or equal to the threshold voltage $V_T$, the transistor 50 turns on, and the drain current becomes high (i.e., equal to the predetermined drain current corresponding to the $V_T$). The value of the gate voltage that generates the high drain current represents the threshold voltage $V_T$ of the transistor 50.

Typically, states of memory cells in a block or a page of a memory array are sensed at a time. The gates of the transistors of the memory cells in the block are connected to a WL. The WL is selected, and a voltage is applied to the WL. The states of N-bit memory cells are sensed by stepping through ($2^N-1$) voltages on the WL and determining the threshold voltages of the transistors when the drain currents of the transistors first exceed a predetermined (preprogrammed) value.

Referring now to FIGS. 3A and 3B, the threshold voltage of the transistor 50 is measured as follows. For example only, the transistor 50 may have one of four threshold voltages $V_{T1}$ to $V_{T4}$, where $V_{T1} < V_{T2} < V_{T3} < V_{T4}$. Accordingly, the memory cell 14-$i$ may have one of four states 00, 01, 10, and 11.

In FIG. 3A, the control module 19 comprises a voltage generator 20 and current sensing amplifiers 22. The number of current sensing amplifiers is equal to the number of BLs. For example, when the IC 10 comprises B BLs, the current sensing amplifiers 22 include B current sensing amplifiers for B BLs, respectively, where B is an integer greater than 1.

In FIG. 3B, the WL decoder 16 selects a WL comprising memory cells 14-1, 14-2, ..., 14-$i$, ..., and 14-$n$ (collectively memory cells 14) when the states of the memory cells are to be determined. Each of the memory cells 14 includes a transistor similar to the transistor 50. The transistors are shown as capacitances C that store the charge in the gates.

When a read operation begins, the voltage generator 20 supplies a voltage (e.g., a staircase voltage) to the WL decoder 16. The WL decoder 16 inputs the voltage to the selected WL. Accordingly, the voltage is applied to the gates of the transistors on the selected WL.

The current sensing amplifiers 22 include one current sensing amplifier for each BL. For example, a current sensing amplifier 22-$i$ communicates with a bit line BL-$i$ and senses the drain current that flows through the transistor 50 of the memory cell 14-$i$. The current sensing amplifier 22-$i$ senses the drain current by applying a small voltage across the source and the drain of the transistor 50.

Each current sensing amplifier senses the drain current through the respective one of the transistors of the memory cells 14. The control module 19 measures the threshold voltages of the transistors based on the drain currents sensed by the respective current sensing amplifiers 22.

SUMMARY

A system comprises a voltage generator and a reference voltage setting module. The voltage generator is configured to generate K voltages to be applied to memory cells. The K voltages are used to determine a reference voltage used to read the memory cells, where K is an integer greater than 1. The reference voltage setting module is configured to selectively set the reference voltage to a value between two adjacent ones of the K voltages or one of the two adjacent ones of the K voltages.

In other features, the system further comprises a sensing module and a counting module. The sensing module is configured to sense currents through the memory cells when each of the K voltages is applied to the memory cells. The counting module is configured to count, based on the currents, numbers of the memory cells having threshold voltages between pairs of the K voltages, where the pairs include adjacent ones of the K voltages. The reference voltage setting module selects one of the pairs having a smallest of the numbers and sets the reference voltage to the value between or equal to one of the two adjacent ones of the K voltages corresponding to the one of the pairs.

In other features, the system further comprises a sensing module and a counting module. The sensing module is configured to sense currents through the memory cells when each of the K voltages is applied to the memory cells. The counting module is configured to count, based on the currents, numbers of 1's or 0's detected for pairs of the K voltages, where the pairs include adjacent ones of the K voltages. The reference voltage setting module selects one of the pairs having a smallest of the numbers and sets the reference voltage to the value between or equal to one of the two adjacent ones of the K voltages corresponding to the one of the pairs.

In other features, the system further comprises a sensing module and a counting module. The sensing module is configured to sense currents through the memory cells when each of the K voltages is applied to the memory cells. The counting module is configured to count, based on the currents, numbers of the memory cells having threshold voltages between pairs of the K voltages, where the pairs include adjacent ones of the K voltages. The counting module is further configured to generate average counts for the pairs by averaging the numbers counted for a plurality of the pairs. The reference voltage setting module selects one of the pairs having a smallest of the average counts and sets the reference voltage to the value between or equal to one of the two adjacent ones of the K voltages corresponding to the one of the pairs.

In other features, the system further comprises a selector module when the memory cells store 3-bits each, the reference voltage is one of seven reference voltages, and when Gray mapping is used to map states of the memory cells. The selector module is configured to select a most significant bit (MSB) page comprising MSB's of the memory cells when the reference voltage being determined is fourth of the seven reference voltages. The selector module is further configured to select a least significant bit (LSB) page comprising LSB's of the memory cells when the reference voltage being determined is one of first, third, fifth, and seventh of the seven reference voltages. The selector module is further configured to select a central significant bit (CSB) page comprising CSB's of the memory cells when the reference voltage being determined is one of second and sixth of the seven reference voltages.

In other features, the system further comprises an optimization module configured to determine when to optimize the reference voltage based on one of a number of erase/program cycles performed on the memory cells, a number of read errors detected over a period of time when reading the memory cells, and a period of time elapsed since a prior optimization of the reference voltage.

In other features, a memory integrated circuit (IC) comprises the system and further comprising a memory array including the memory cells.

In still other features, a method comprises generating K voltages to be applied to memory cells, where K is an integer greater than 1. The K voltages are used to determine a reference voltage used to read the memory cells. The method further comprises selectively setting the reference voltage to a value between two adjacent ones of the K voltages or one of the two adjacent ones of the K voltages.

In other features, the method further comprising sensing currents through the memory cells when each of the K voltages is applied to the memory cells. The method further comprises counting, based on the currents, numbers of the memory cells having threshold voltages between pairs of the K voltages, where the pairs include adjacent ones of the K voltages. The method further comprises selecting one of the pairs having a smallest of the numbers and setting the reference voltage to the value between or equal to one of the two adjacent ones of the K voltages corresponding to the one of the pairs.

In other features, the method further comprises sensing currents through the memory cells when each of the K voltages is applied to the memory cells. The method further comprises counting, based on the currents, numbers of 1's or 0's detected for pairs of the K voltages, wherein the pairs include adjacent ones of the K voltages. The method further comprises selecting one of the pairs having a smallest of the numbers and setting the reference voltage to the value between or equal to one of the two adjacent ones of the K voltages corresponding to the one of the pairs.

In other features, the memory cells store 3-bits each, the reference voltage is one of seven reference voltages, and Gray mapping is used to map states of the memory cells. The method further comprises selecting a most significant bit (MSB) page comprising MSB's of the memory cells when the reference voltage being determined is fourth of the seven reference voltages. The method further comprises selecting a least significant bit (LSB) page comprising LSB's of the memory cells when the reference voltage being determined is one of first, third, fifth, and seventh of the seven reference voltages. The method further comprises selecting a central significant bit (CSB) page comprising CSB's of the memory cells when the reference voltage being determined is one of second and sixth of the seven reference voltages.

In other features, the method further comprises sensing currents through the memory cells when each of the K voltages is applied to the memory cells. The method further comprises counting, based on the currents, numbers of the memory cells having threshold voltages between pairs of the K voltages, where the pairs include adjacent ones of the K voltages. The method further comprises generating average counts for the pairs by averaging the numbers counted for a plurality of the pairs. The method further comprises selecting one of the pairs having a smallest of the average counts and setting the reference voltage to the value between or equal to one of the two adjacent ones of the K voltages corresponding to the one of the pairs.

In other features, the method further comprises determining when to optimize the reference voltage based on one of a number of erase/program cycles performed on the memory cells, a number of read errors detected over a period of time when reading the memory cells, and a period of time elapsed since a prior optimization of the reference voltage.

In still other features, the systems and methods described above are implemented by a computer program executed by one or more processors. The computer program can reside on a tangible computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIGS. 6A-6D are flowcharts of a method for optimizing reference voltages of memory cells.

DESCRIPTION

Figure 2:
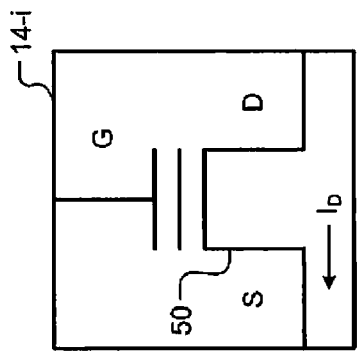
FIG. 2 is a schematic of a multi-level memory cell.
Figure 1:
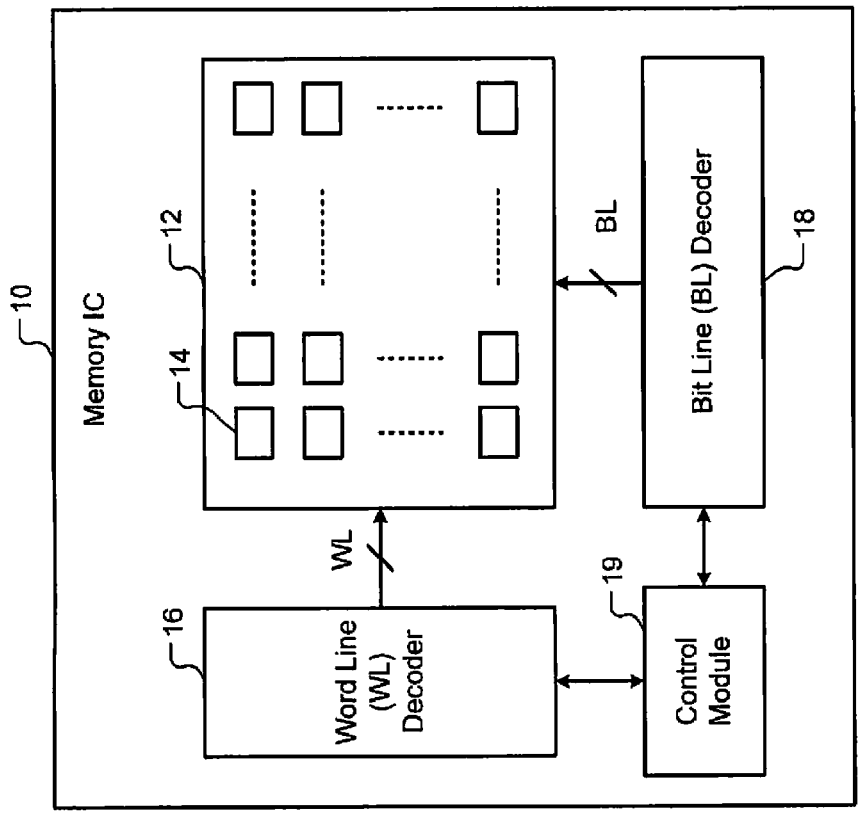
FIG. 1 is a functional block diagram of a memory integrated circuit (IC)
Figure 3A:
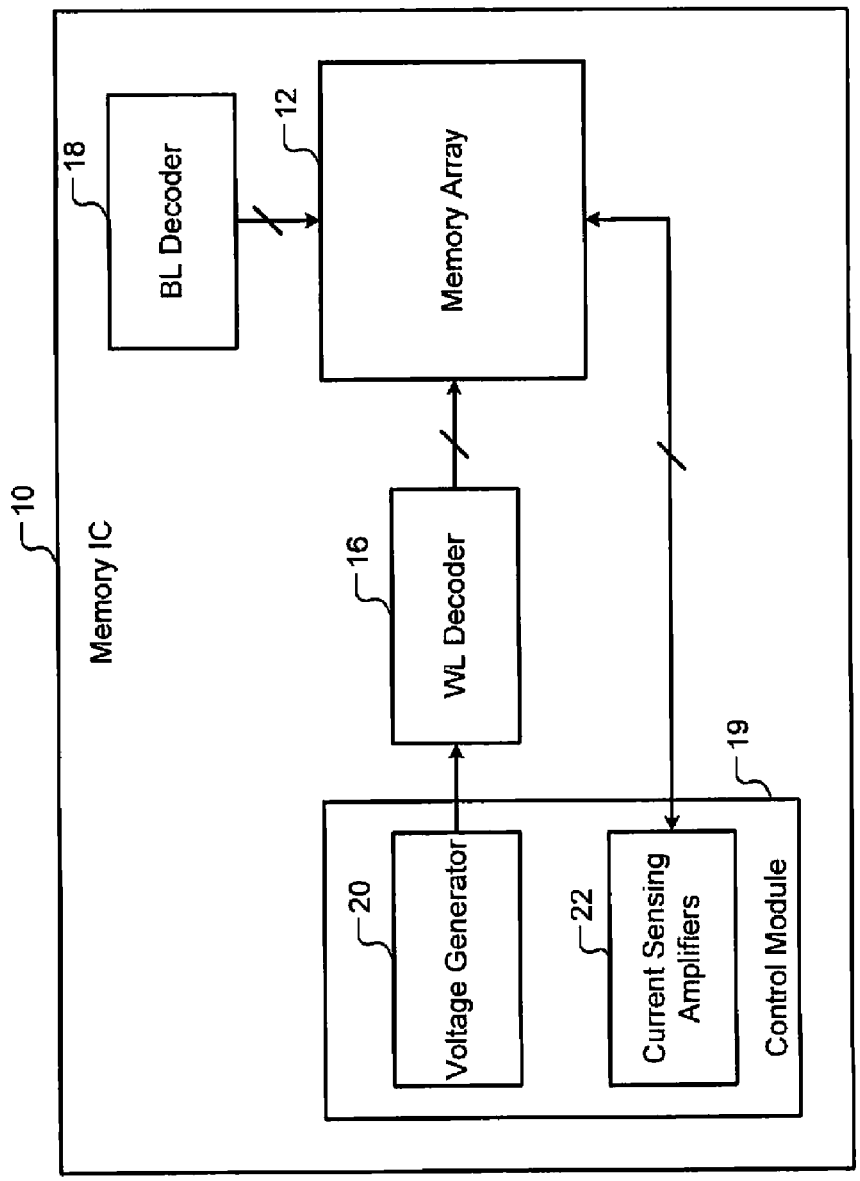
FIGS. 3A and 3B are functional block diagrams of the memory IC of FIG. 1.
Figure 3B:
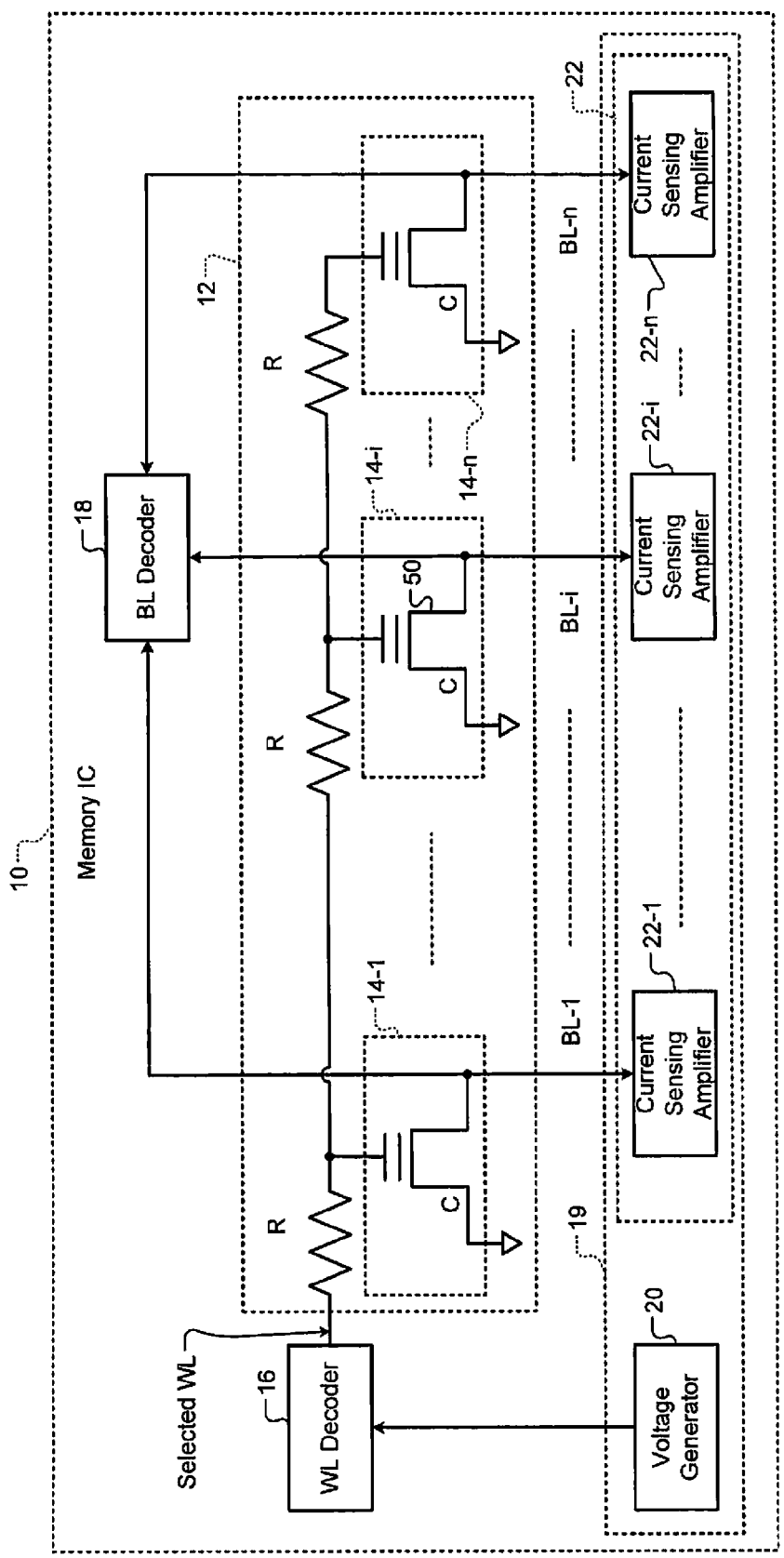

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

States of nonvolatile memory cells that store data by storing different amounts of charge can be sensed by measuring threshold voltages of the memory cells. The threshold voltages are compared to predetermined reference voltages to determine the states of the memory cells. Initially, the reference voltages are set at the time of manufacturing. Due to wear and tear during normal usage and changes in operating environment, however, threshold voltage distributions of the memory cells may change. Accordingly, to minimize read errors, the reference voltages may be periodically optimized to track the changes in the threshold voltage distributions.

The present disclosure relates to novel systems and methods for optimizing the reference voltages. These novel systems and methods differ from conventional approaches in many ways. For example, unlike conventional approaches, these novel systems and methods do not rely on the data stored in the memory cells, or on any error correcting code (ECC) used in storing the data, to optimize the reference voltages. Instead, these systems and methods optimize the reference voltages independently of the data stored in the memory cells and independently of any ECC used in storing the data. Additionally, unlike conventional approaches, these systems and methods optimize each reference voltage independently of the other reference voltages instead of optimizing all the reference voltages jointly.

Accordingly, the systems and methods of the present disclosure are more simple and practical to implement than the conventional approaches. Additionally, since these systems and methods do not rely on the data stored or the ECC used, these systems and methods are useful in implementations where the ECC is unavailable or where the ECC fails. Before describing these systems and methods, variations in threshold voltage distributions and their effect on read errors are discussed below.

Typically, flash memory cells store data by trapping granulized amounts of charge in an isolated region of a transistor called a floating gate. Data is typically retrieved from the memory cell by applying a read voltage to the transistor and subsequently estimating the readout current, which is determined by the amount of charge trapped in the memory cell.

Memory cells may store one or more bits per cell and may be called single-level or multi-level memory cells, respectively. A single-level memory cell may store one bit of information. For example only, the bit may be logic 0 when charge is stored in the memory cell or logic 1 when no charge stored in the memory cell.

The multi-level memory cells may store more than one bit of information by storing varying amounts of charge or charge levels. For example, suppose Q is the maximum amount of charge that can be trapped in a multi-level memory cell. More than one bit of information can be stored in such a memory cell by storing a granulized amount of charge between 0 and Q. For example only, two bits of information may be stored in one multi-level memory cell by trapping any one of four levels of charges: 0, Q/3, 2Q/3, Q.

The process of trapping charge is called programming. The various levels of trapped charges translate into different threshold voltages for the memory cell. The data stored in the memory cell can be retrieved by estimating the amount of charge stored in the memory cell.

Specifically, memory cells can be viewed as a pulse-amplitude modulation (PAM) communication system. Accordingly, data can be stored in the memory cells using encoding techniques similar to those used in the PAM communication system (e.g., Gray mapping). Additionally, data stored in the memory cells can be detected using signal processing techniques similar to those used in the PAM communication system.

Figure 4A:
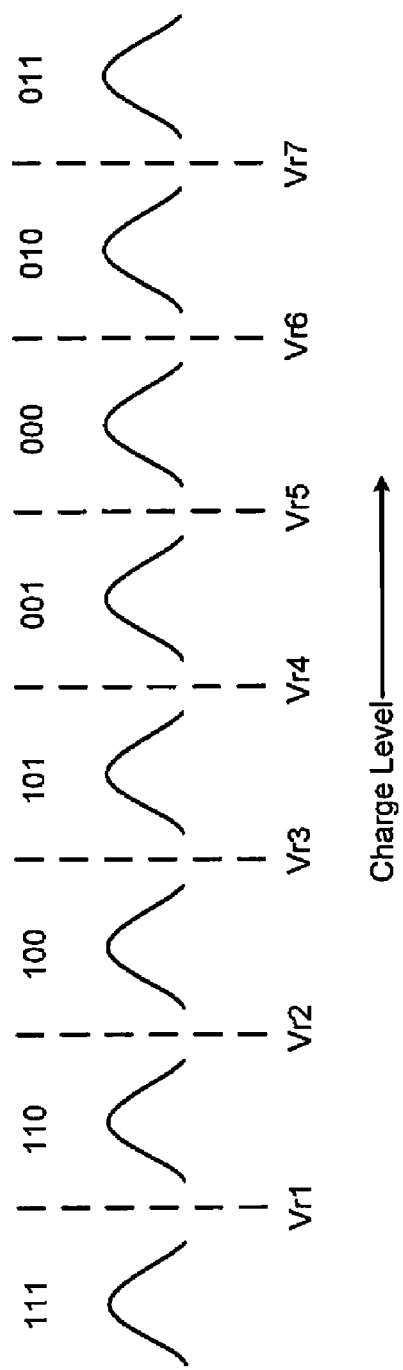
FIG. 4A depicts charge level distributions of a 3-bit memory cell.

Referring now to FIG. 4A, an example of a threshold voltage distribution for a 3-bit memory cell is shown. The 3-bit memory cell is used throughout the present disclosure for example only. The teachings of the present disclosure are applicable to N-bit memory cells having $2^N$ threshold voltages and ($2^N-1$) reference voltages, where N is an integer greater than 1.

The 3-bit memory cell can store up to eight different levels of charge, where each charge level corresponds to one of eight different states. Accordingly, the threshold voltage distribution of the memory cell includes eight different threshold voltages. The eight threshold voltages are associated with the eight levels of charge that can be stored in the memory cell, respectively.

Intersections of adjacent charge levels define reference voltages that may be used to detect the data stored in the memory cell during read operations. Accordingly, the 3-bit memory cell has seven reference voltages ($V_{r1}$ through $V_{r7}$) that are located where adjacent distribution curves intersect.

The reference voltages should be known during a read operation to determine the level of charge and consequently the data stored in the memory cell. Initially, the reference voltages are set at the time of manufacture. Subsequently, during normal read operations, the threshold voltage of the memory cell is measured and compared to the seven reference voltages to determine the data stored in the memory cell.

For example only, when the threshold voltage is less than or equal to $V_{r1}$, the data stored in the memory cell may be 111. When the threshold voltage is less than or equal to $V_{r2}$ and greater than $V_{r1}$, the data stored in the memory cell may be 110, and so on. Finally, when the threshold voltage is greater than $V_{r7}$, the data stored in the memory cell may be 011.

Figure 4B:
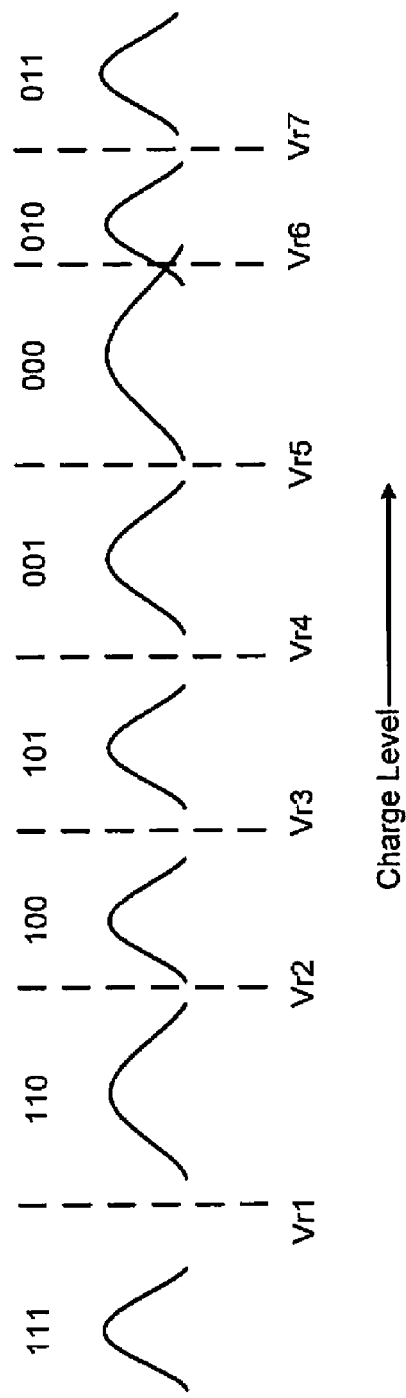
FIG. 4B depicts drifts in the level distributions of FIG. 4A due to cycling of the 3-bit memory cell.

Referring now to FIG. 4B, memory cells such as the multi-level flash memory cells may be subjected to charge retention loss after repeated read, write, erase, and/or program operations (collectively called cycling). For example, the oxide surrounding the floating gates of the memory cells may degenerate after repeated cycling. Consequently, the threshold voltage distributions may change or drift after cycling as shown.

Accordingly, after cycling, data read using initial reference voltages from before cycling may be incorrect unless the initial detection thresholds are adjusted for the drift due to cycling. To account for the drift due to cycling and to minimize errors during read operations after cycling, the reference voltages may be optimized at certain times during operation.

Figure 5A:
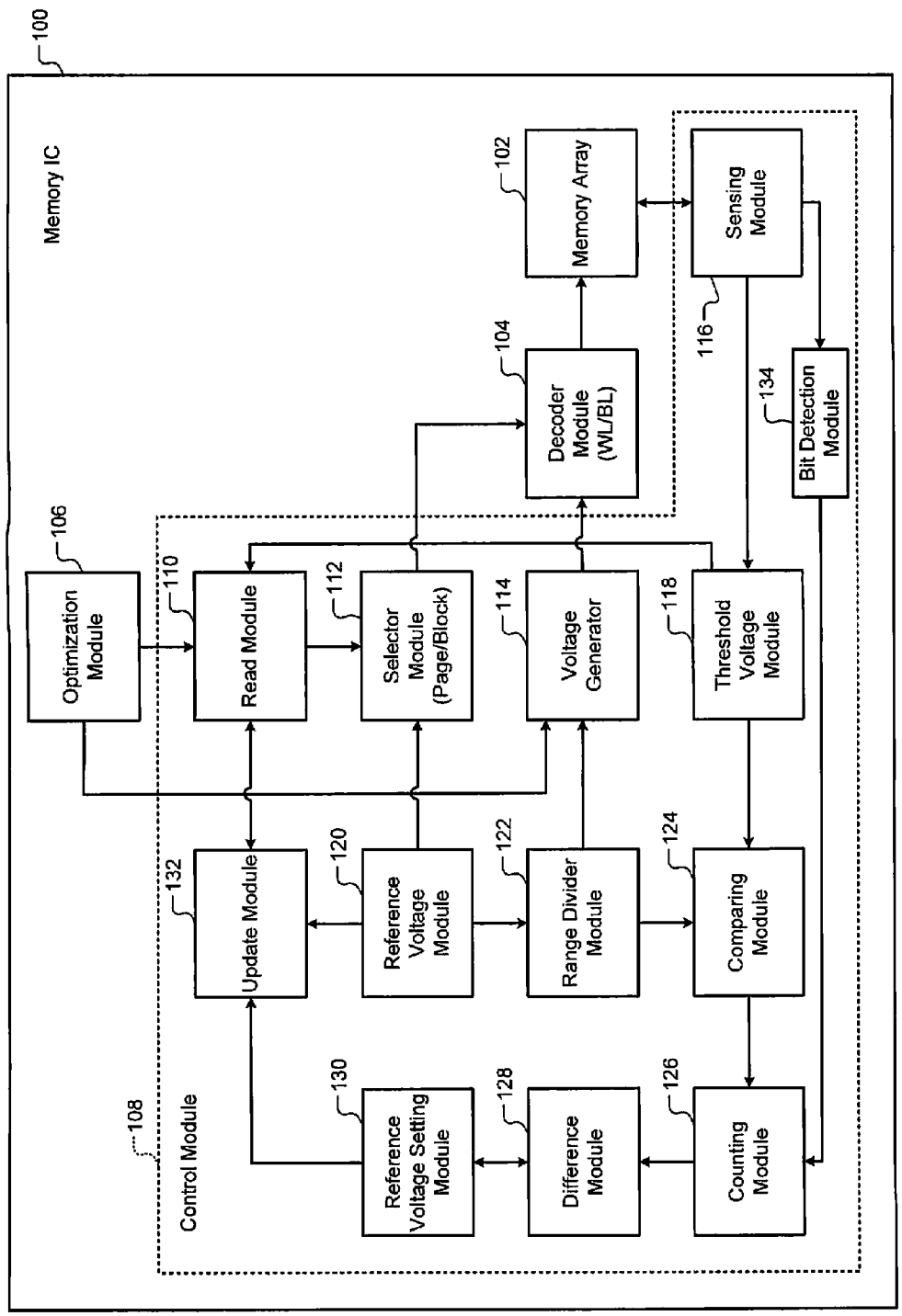
FIG. 5A is a functional block diagram of a system for optimizing reference voltages of memory cells.
Figure 5B:
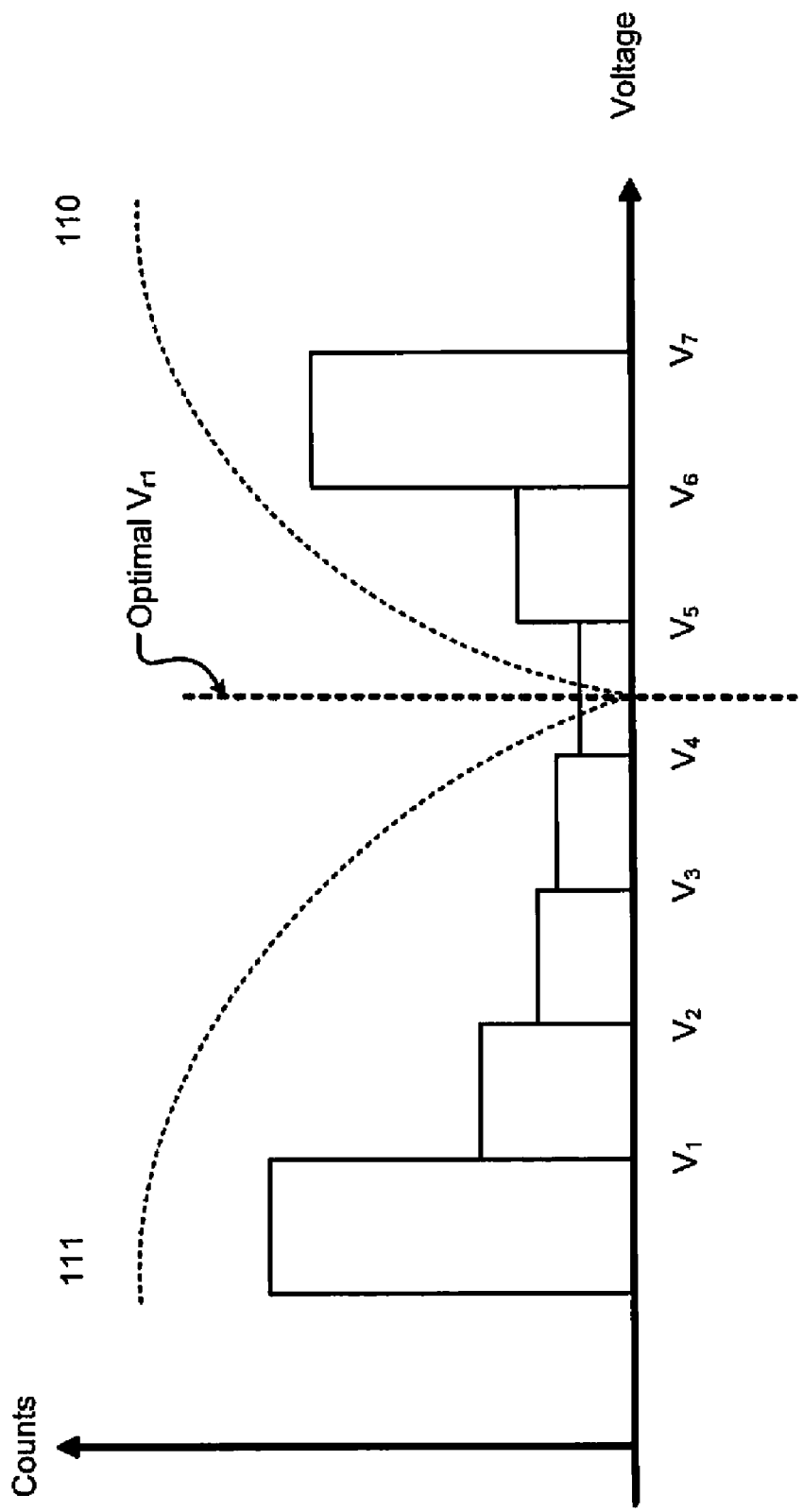
FIG. 5B depicts a histogram used to find an optimized reference voltage.
Figure 5C:
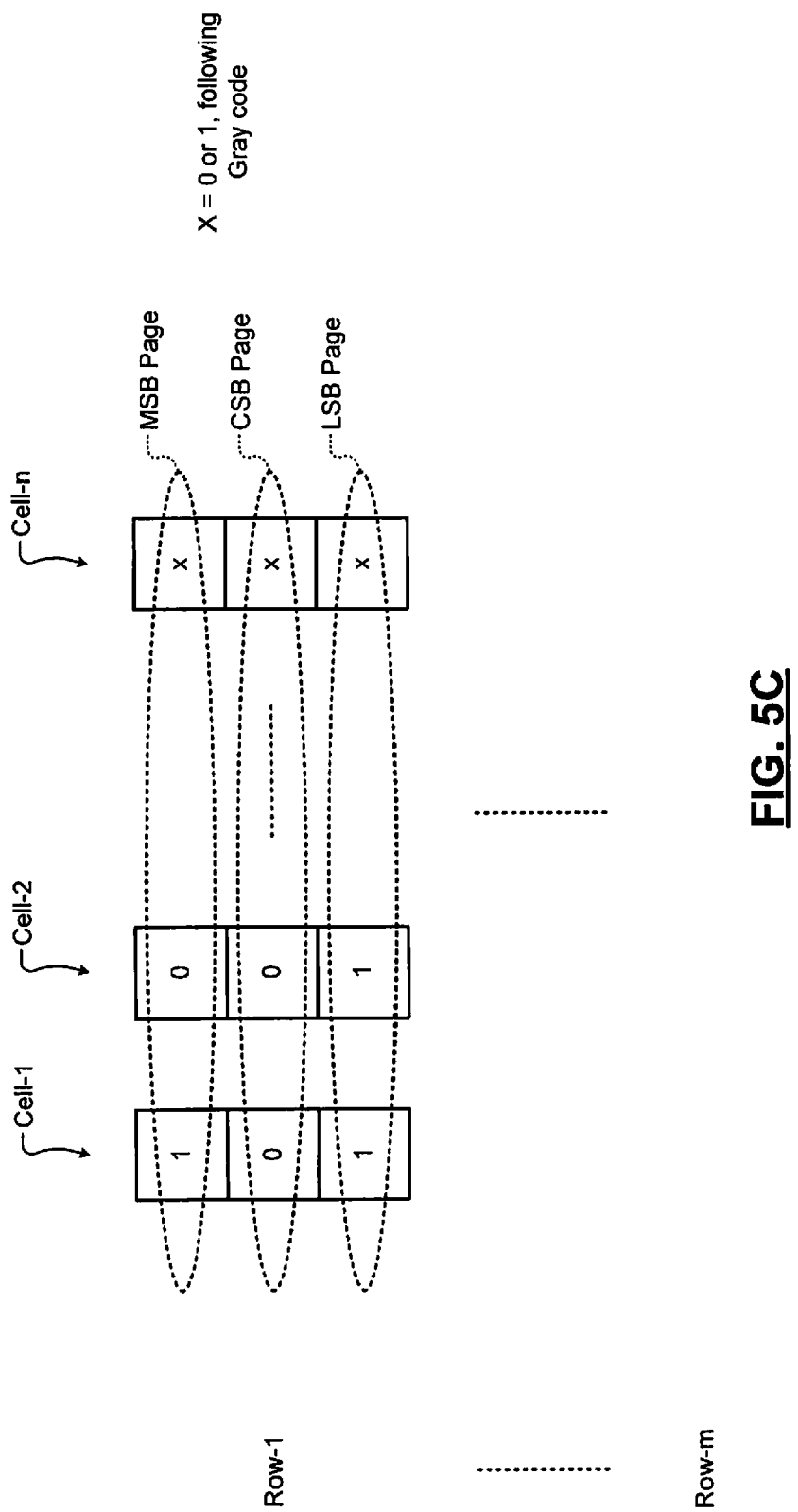
FIG. 5C depicts a schematic of a row of memory cells.

Referring now to FIGS. 5A-5C, a memory IC 100 comprising a system for optimizing the reference voltages is shown. In FIG. 5A, the memory IC 100 is shown. In FIG. 5B, a histogram is shown and is used to explain reference voltage optimization. In FIG. 5C, Gray mapping used for state encoding is shown and is used to explain different procedures for optimizing the reference voltages.

In FIG. 5A, the memory IC 100 comprises a memory array 102, a decoder module 104, an optimization module 106, and a control module 108. The memory array 102 comprises memory cells arranged in rows and columns. For example only, the memory cells may be 3-bit memory cells. The decoder module 104 utilizes word line and bit line decoders to address the memory cells.

The optimization module 106 determines when to optimize the reference voltages. The optimization module 106 may use a variety of criteria to optimize the reference voltages. For example, the criteria may include, but are not limited to, a number of erase/program (EP) cycles, a number of read errors, a period of time elapsed since last optimization, etc. The criteria may be programmable. The optimization module 106 selectively enables and disables portions of the control module 108 as explained below.

The control module 108 comprises a read module 110, a selector module 112, a voltage generator 114, a sensing module 116, and a threshold voltage module 118. During normal operation, the optimization module 106 enables these modules (110 through 118) to perform read operations. The read module 110 receives read commands from a host (not shown). The selector module 112 selects pages/blocks of memory cells to be read according to the read commands. The decoder module 104 addresses the selected memory cells in the memory array 102.

The voltage generator 114 generates voltages that are applied to the selected memory cells. The sensing module 116 comprises current sensing amplifiers that sense drain currents of the selected memory cells. The threshold voltage module 118 determines the threshold voltages of the selected memory cells based on the drain currents. The read module 110 compares the threshold voltages to reference voltages and determines the state of data stored in the selected memory cells.

The control module 108 further comprises reference voltage module 120, a range divider module 122, a comparing module 124, a counting module 126, a difference module 128, a reference voltage setting module 130, an update module 132, and a bit detection module 134. The bit detection module 134 is described with reference to FIG. 5C.

The optimization module 106 enables these modules (120 through 134) when the reference voltages are to be optimized. The optimization module 106 disables these modules (120 through 134) during normal operation. The optimization module 106 may disable the read module 110 during reference voltage optimization.

Additionally, during optimization, the optimization module 106 may disable portions of the voltage generator 114 that generate voltages for normal read operations. Instead, the optimization module 106 enables portions of the voltage generator 114 that generate voltages that may be different than those generated during normal operation.

When optimization begins, the reference voltage module 120 selects a reference voltage that is to be optimized. For example, the reference voltage module 120 may select the reference voltage $V_{r1}$ for optimization. When one reference voltage is selected for optimization, the reference voltage module 120 keeps the other unselected reference voltages fixed at reasonable values. For example, when the reference voltage $V_{r1}$ is selected for optimization, the reference voltages $V_{r2}$ though $V_{r7}$ are kept fixed. When the reference voltage $V_{r2}$ is selected for optimization, the reference voltages $V_{r1}$ and $V_{r3}$ though $V_{r7}$ are kept fixed, and so on.

In a typical 3-bit NAND flash memory cell, the reference voltages $V_{r1}$ through $V_{r7}$ may range between 0V and 6V. Accordingly, the adjacent reference voltages may differ by approximately 0.8V (6V divided by seven). The reference voltage module 120 may set the unselected reference voltages to reasonable values based on the above approximation. Alternatively, the reference voltage module 120 may maintain the unselected reference voltages at their current values. The actual values of the unselected reference voltages are immaterial so long as they are kept fixed while a selected one of the reference voltages is being optimized.

Additionally, the reference voltage module 120 determines a group of memory cells in the memory array 102 to use during the optimization. For example, the group of memory cells may include one or more pages, blocks, or the entire memory array 102. The selector module 112 selects the memory cells based on the group selected by the reference voltage module 120. The decoder module 104 addresses the selected memory cells.

Typically, a reference voltage may deviate within a range. For example, the reference voltage may shift by +/−0.1V (i.e., within a range of say 0.2V) relative to its initial value. Accordingly, for example, a reference voltage having an initial value of 0.8V may have any value within the range 0.7V to 0.9V.

The value of the reference voltage may be updated to any value within the range depending on desired accuracy. Based on the desired accuracy, the range may be divided into a number of units called bins or bands. For example, the range of 0.2V may be divided into five bins, where each bit is 0.04V wide. Accordingly, the reference voltage that may range between 0.7V and 0.9V can be optimized at 0.04V increments.

The range divider module 122 selects a range within which to adjust the reference voltages and divides the range into a finite number of voltage levels. For generality, the range divider module 122 may select K possible candidate values ranging from $v_1$ to $v_k$ for optimizing a reference voltage. For example, for a reference voltage having an initial value of 0.8V and having a range of 0.7V-0.9V, the candidate values may include 0.7V, 0.74V, 0.78V, 0.82V, 0.86V, and 0.9V. Hereinafter, the candidate values are called target voltages.

For each reference voltage, the range divider module 122 may select a different range and/or a different number of target voltages. For example, the selection may be based on a history of optimizations performed. Depending on the selection made by the range divider module 122, the voltage generator 114 generates appropriate target voltages for the reference voltage being optimized.

For example, optimization of the reference voltage $V_{r1}$ is now explained in detail. For generality, the reference voltage $V_{r1}$ may be optimized to any value between target voltages $v_1$ and $v_k$. Initially, the voltage generator 114 applies a target voltage $v_1$ to the selected memory cells. The sensing module 116 senses drain currents of the selected memory cells. The threshold voltage module 118 determines the threshold voltages of the selected memory cells based on the drain currents. The comparing module 124 compares the threshold voltages to target voltage $v_1$. The counting module 126 counts the number of memory cells having threshold voltages less than the target voltage $v_1$ and stores the count as N1.

Subsequently, the voltage generator 114 applies a target voltage $v_2$ to the selected memory cells. The sensing module 116 senses drain currents of the selected memory cells. The threshold voltage module 118 determines the threshold voltages of the selected memory cells based on the drain currents. The comparing module 124 compares the threshold voltages to target voltage $v_2$. The counting module 126 counts the number of memory cells having threshold voltages less than the target voltage $v_2$ and stores the count as N2.

The difference module 128 determines the difference (N2−N1). The difference (N2−N1) represents the number of selected memory cells having threshold voltages between $v_1$ and $v_2$. The procedure is repeated for the remaining target voltages ($v_3, \ldots,$ and $v_k$). The counting module 126 counts number of memory cells having threshold voltages in the voltage range bound by each pair of successive target voltages. Each pair of successive target voltages may be called a bin, and the count for each bin may be called a bin count.

The reference voltage setting module 130 selects the bin having the smallest bin count. The reference voltage setting module 130 sets the value of the reference voltage $V_{r1}$ to one of the pair of successive target voltages that form the selected bin. Alternatively, the reference voltage setting module 130 may set the value of the reference voltage $V_{r1}$ to any value between the two successive target voltages that form the selected bin.

Occasionally, the bin counts can fluctuate due to read variations when successive target voltages are applied. Particularly, the bin count can fluctuate when the number of cells in a bin is small. To smooth out the fluctuations, average bin counts can be generated, and the smallest bit count is selected from the average bin counts. For convenience, bin counts before averaging are called raw bin counts, and bin counts after averaging are called average bin counts.

For each bin, an average bin count can be generated by averaging raw bin counts of W neighboring bins, where W is a programmable integer. Specifically, an average bin count for an $I^{th}$ bin can be calculated as BIN_COUNT(I)=AVERAGE(BIN_COUNT(I−W), BIN_COUNT(I−W+1), . . . , BIN_COUNT(I+W−1), BIN_COUNT(I+W)), where W is a programmable integer.

For example, suppose W=3. For the first or last bins, since there are no neighboring bins to the left or right, the raw bins counts of immediate neighboring bins can be used. For example, when W=3, to calculate the average bin count for the first bin, the average of the raw bin counts of the first three bins can be used. After generating average bin counts for each bin using the above formula, the smallest of the average bin counts can be selected.

In FIG. 5B, for example only, a histogram of bin counts when optimizing the reference voltage $V_{r1}$ is shown. For example only, the number of target voltages selected are $v_1$ through $v_6$ (K=6) although any number of target voltages may be alternatively selected. As shown, the charge distribution curves for states 111 and 110 intersect where the bin count is smallest. Accordingly, the optimal value for the reference voltage $V_{r1}$ is any value between the successive target voltages $v_4$ and $v_5$. Accordingly, in the example shown, the reference voltage setting module 130 may set the reference voltage $V_{r1}$ to any value between $v_4$ and $v_5$, including either $v_4$ or $v_5$.

The above procedure is repeated for each reference voltage ($V_{r2}, V_{r3}, \ldots,$ and $V_{r7}$ for 3-bit memory cells) while keeping the unselected reference voltages fixed. The update module 132 updates the reference voltages with the optimized values. For example, in the example shown in FIG. 5B, the update module 132 changes the value of the reference voltage $V_{r1}$ from its current value to any value between $v_4$ and $v_5$, including either $v_4$ or $v_5$. After optimization of all the reference voltages is completed, the updated values of the reference voltages are used by the read module 110 during normal read operations. Using the updated values of the reference voltages reduces read errors.

In general, the above optimization procedure may be summarized for 3-bit memory cells as follows. To optimize the reference voltage $V_{r1}$, assume K possible target voltages $v_1$ through $v_k$. While keeping other reference voltages fixed, perform the following steps to adjust $V_{r1}$. For i=1 to (K−1), apply target voltages $v_i$ and $v_{i+1}$; count the number of memory cells having threshold voltages falling within the bin defined by the target voltages $v_i$ and $v_{i+1}$; and determine count $M_i$= ($N_{i+1}-N_i$). Find index j with the smallest count $M_i$. Set the value of the reference voltage $V_{r1}$ to $v_j$, $v_{j+1}$, or any value between $v_j$ and $v_{j+1}$. Repeat the above optimization procedure to optimize one or more of the remaining reference voltages ($V_{r2}, V_{r3}, \ldots,$ and $V_{r7}$ for 3-bit memory cells).

The optimization procedure described below may be used when memory ICs use Gray mapping for state encoding. For example only, the states of a 3-bit memory cell encoded using Gray mapping are shown in FIG. 4A. The states are 111, 110, 100, 101, 001, 000, 010, and 011. Due to Gray mapping, the adjacent states differ only by one bit. Further, the states 101-001 differ only in the most significant bit (MSB). The states 111-110, 100-101, and 001-000 differ only in the least significant bit (LSB). The states 110-100 and 000-010 differ only in the central significant bit (CSB).

In FIG. 5C, normal read operations may involve reading memory cells in pages. Reading a page involves reading only portions of the memory cells in the page. For example, a page comprising only MSB's of memory cells, called an MSB page, may be read during a read operation. Similarly, LSB pages or CSB pages may be read during read operations.

When an MSB page is read, only the reference voltage $V_{r4}$ is relevant to detect the MSB's. Accordingly, when optimizing the reference voltage $V_{r4}$, only the MSB pages may be selected. When a CSB page is read, only the reference voltages $V_{r2}$ and $V_{r6}$ are relevant to detect the CSB's. Accordingly, when optimizing the reference voltages $V_{r2}$ and $V_6$, only the CSB pages may be selected. When an LSB page is read, only the reference voltages $V_{r1}$, $V_{r3}$, $V_{r5}$, and $V_{r7}$ are relevant to detect the LSB's. Accordingly, when optimizing the reference voltages $V_{r1}$, $V_{r3}$, $V_{r5}$, and $V_{r7}$, only the LSB pages may be selected.

Under Gray mapping, the bin counts can be replaced by a count of bit values being 1 (or 0) at the bit position where the adjacent states differ. Specifically, when a target voltage is applied to selected pages, the number of memory cells having a threshold voltage less than the target voltage is not counted. Instead, a target voltage is applied to a selected page or pages (LSB, MSB, or CSB pages). When the memory cells in the selected pages are read, only a number of 1's detected may be counted. Alternatively, only a number of 0's detected may be counted. The count indicates the number of memory cells having threshold voltages less than the target voltage.

More specifically, in FIG. 5A, when optimizing the reference voltage $V_{r4}$, the selector module 112 selects only MSB pages of the memory array 102. The remaining reference voltages are kept fixed at reasonable values (e.g., present values).

Initially, the voltage generator 114 applies the target voltage $v_1$ to the word line that addresses the memory cells of the selected pages. The sensing module 116 senses drain currents of the memory cells in the selected pages. The bit detection module 134 detects the number of 1's based on the drain currents. The counting module 126 counts the number of 1's detected and stores the count as N1. N1 indicates the number of memory cells in the selected pages having threshold voltages less than the target voltage $v_1$.

Subsequently, the voltage generator 114 applies the target voltage $v_2$ to the word line that addresses the memory cells of the selected pages. The sensing module 116 senses drain currents of the memory cells in the selected pages. The bit detection module 134 detects the number of 1's based on the drain currents. The counting module 126 counts the number of 1's detected and stores the count as N2. N2 indicates the number of memory cells in the selected pages having threshold voltages less than the target voltage $v_2$.

The difference module 128 generates a difference (N1−N2). The procedure is repeated for the remaining target voltages $v_3$, $v_4$, and so on. The reference voltage setting module 130 selects the target voltage pair for which the difference (N1−N2) is the smallest. The reference voltage setting module 130 sets the value of the reference voltage $V_{r4}$ to one of the target voltages from the target voltage pair for which the difference (N1−N2) is the smallest or any value in between the two target voltages.

When optimizing the reference voltage $V_{r2}$, the selector module 112 selects only CSB pages of the memory array 102. The remaining reference voltages are kept fixed at reasonable values (e.g., present values). The procedure described above with reference to optimizing the reference voltage $V_{r4}$ is repeated.

When optimizing the reference voltage $V_{r2}$, the counts N1 and N2 will also include the number of 1's detected based on comparisons made using the reference voltage $V_{r6}$. This is because both $V_{r2}$ and $V_{r4}$ reference voltages are used during a read operation in detecting bit values. For example, when the target voltage $v_1$ is applied, the count N1 will include the number of memory cells (say M1) having threshold voltages less than $v_1$ and the number of memory cells (say M1') having threshold voltages greater than the reference voltage $V_{r6}$.

Similarly, when the target voltage $v_2$ is applied, the count N2 will include the number of memory cells (say M2) having threshold voltages less than $v_2$ and the number of memory cells (say M2') having threshold voltages greater than the reference voltage $V_{r6}$. M2' will be approximately equal to M1', however, since the reference voltages other than $V_{r2}$ (i.e., including $V_{r6}$) are kept fixed. Thus, when the difference between N1 and N2 is taken, M1', which accounts for the number of 1's detected due to comparison with $V_{r6}$, will cancel out and will not affect the optimization of $V_{r2}$.

Similarly, when optimizing $V_{r1}$, for example, additional number of 1's detected due to comparisons with $V_{r3}$, $V_{r5}$, and $V_{r7}$ will approximately cancel out and will not affect the optimization of $V_{r1}$. Further, counting only 1's (or only 0's) makes the optimization procedure independent of the actual data stored in the memory cells. In other words, the optimization procedure is blind to the actual data stored in the memory cells. Thus, the reference voltages are optimized regardless of (i.e., without knowing or determining) the data stored in the memory cells.

Figure 6A:
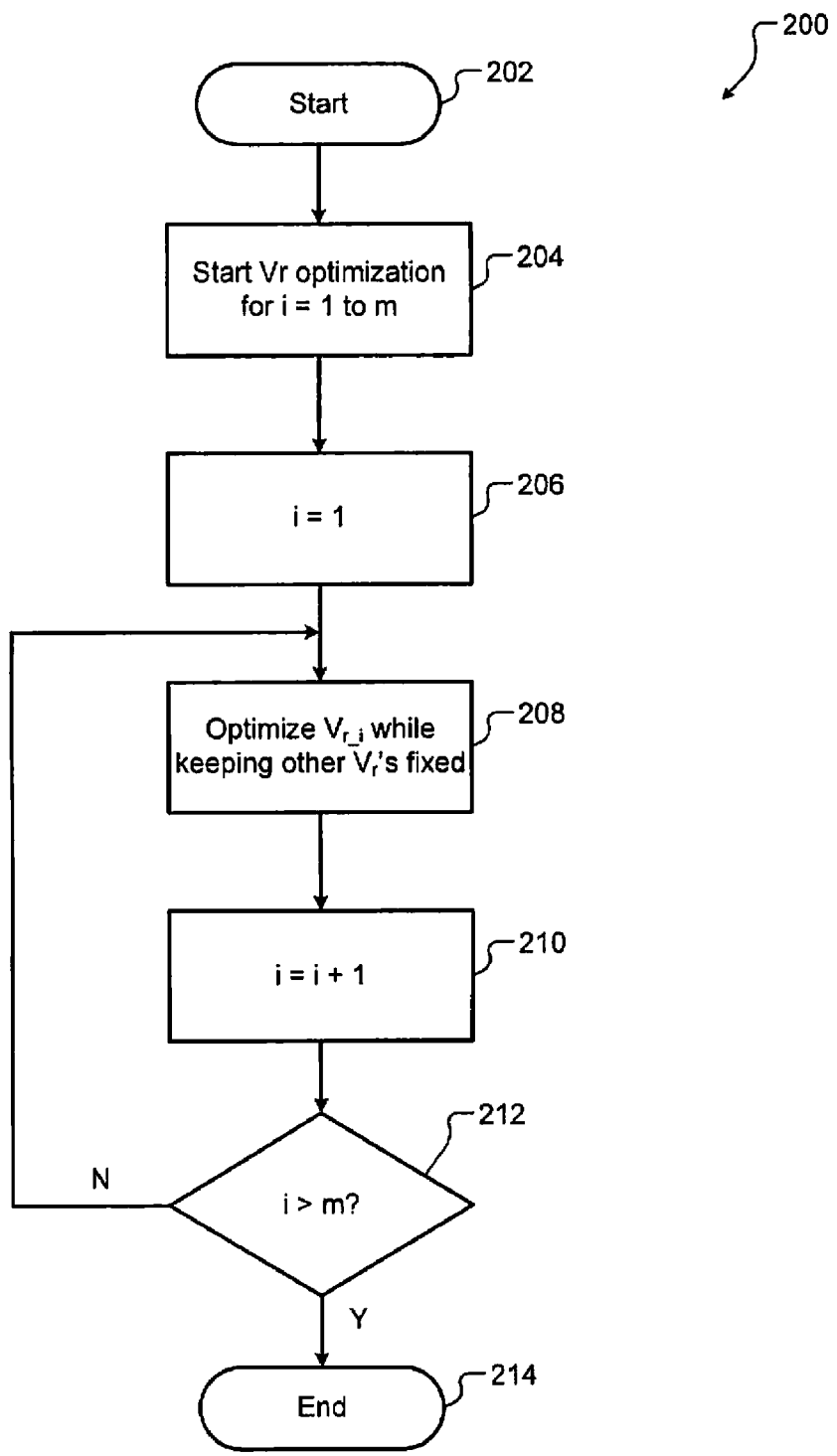
Figure 6B:
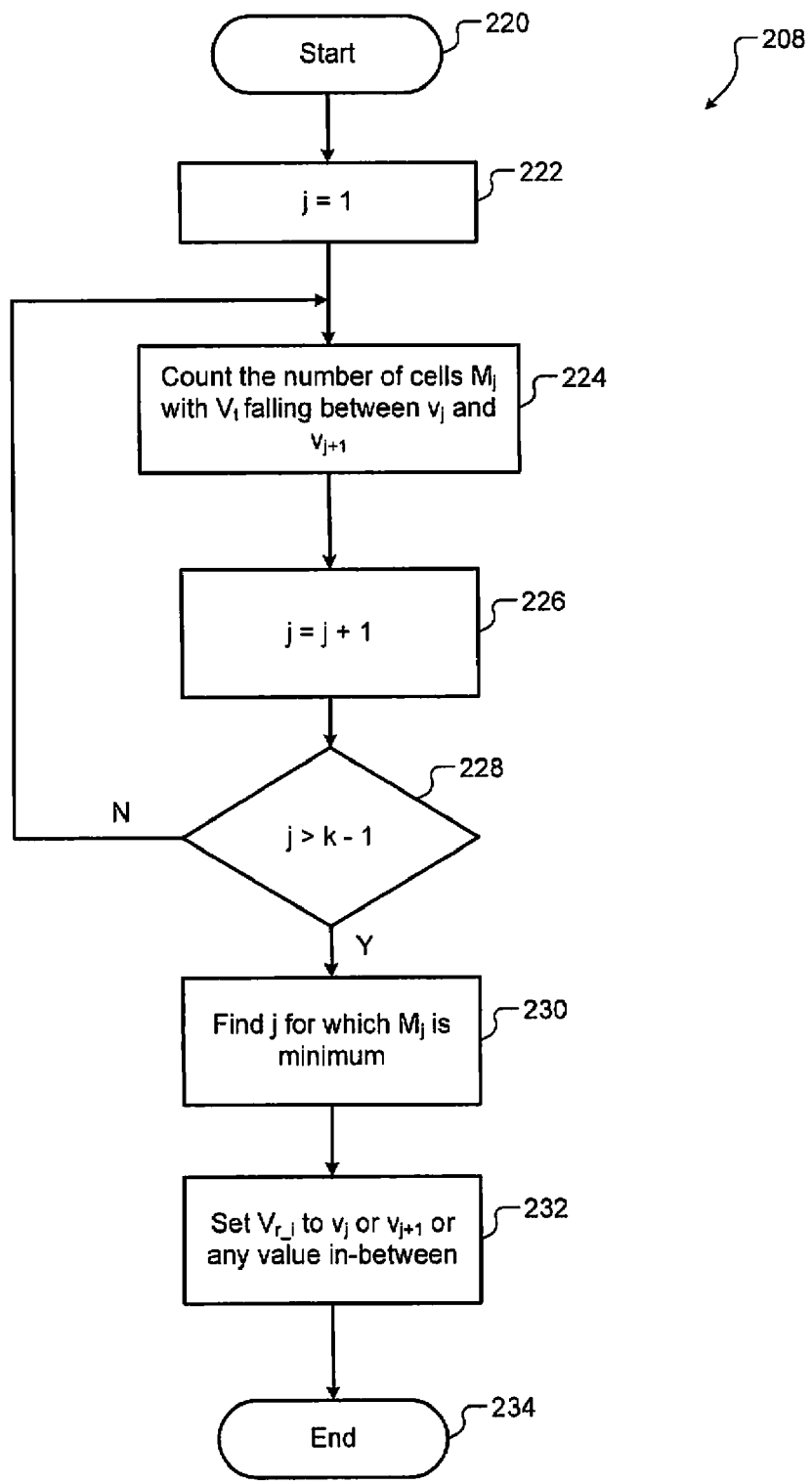

Referring now to FIGS. 6A-6D, a method 200 for optimizing the reference voltages is shown. In FIG. 6A, an overview of the method 200 is shown. In FIGS. 6B-6D, details and alternate procedures of the method 200 are shown.

In FIG. 6A, control begins at 202. At 204, control begins optimizing $V_r$ for i=1 to m. For example only, for 3-bit memory cells, m=7. Control sets i=1 at 206. At 208, control optimizes $V_{r\_i}$ while keeping other $V_r$'s fixed. Control increments i by 1 at 210. Control determines if i is greater than m at 212. Control returns to 208 if i is not greater than m. Control ends at 214 if i is greater than m.

In FIG. 6B, optimization of $V_{r\_i}$ while keeping other $V_r$'s fixed, which is performed at 208 in FIG. 6A, is shown in further detail. Control begins the optimization of $V_{r\_i}$ at 220. Control sets j=1 at 222. At 224, control counts the number of memory cells $M_j$ with threshold voltages ($V_t$) falling between target voltages $v_j$ and $v_{j+1}$. Control increments j by 1 at 226. At 228, control determines if j is greater than (k−1), where k is the total number of target voltages selected for optimizing the reference voltage $V_{r\_i}$. Control returns to 224 if j is not greater than (k−1). At 230, control finds a value of j for which $M_j$ is the smallest if j is greater than (k−1). At 232, control sets $V_{r\_i}$ to $v_j$ or $v_{j+1}$ or any value between $v_j$ and $v_{j+1}$. Control ends optimization of $V_{r\_i}$ at 234 and returns to 210 in FIG. 6A.

In FIGS. 6C and 6D, two approaches for counting performed at 224 in FIG. 6B are shown. The two approaches are labeled 224-1 and 224-2, respectively.

In FIG. 6C, control begins the counting at 240. At 242, control applies $v_j$ to selected memory cells and counts the number of memory cells ($N_j$) with $V_t$ less than $v_j$. At 244, control applies $v_{j+1}$ to the selected memory cells and counts the number of memory cells ($N_{j+1}$) with $V_t$ less than $v_{j+1}$. At 246, control generates the count $M_j = N_j - N_{j+1}$. Control ends the counting at 248 and returns to 226 in FIG. 6B.

In FIG. 6D, control begins the counting at 250. At 252, control applies $v_j$ to selected memory cells and counts the number $N_j$ of 1's (or 0's). At 254, control applies $v_{j+1}$ to the selected memory cells and counts the number $N_{j+1}$ of 1's (or 0's). At 256, control generates the count $M_j = N_j - N_{j+1}$. Control ends the counting at 258 and returns to 226 in FIG. 6B.

Since only one reference voltage is optimized at a time, the complexity of the systems and methods disclosed herein increases only linearly with the number of bits that can be stored per memory cell. Further, statistically, an optimized value of a reference voltage determined according to the present disclosure is a maximum-a-posteriori (MAP) detector, which minimizes the probability of read errors.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
    a voltage generator configured to generate K voltages to be applied to memory cells, wherein the K voltages are used to determine a reference voltage used to read the memory cells, where K is an integer greater than 1;
    a reference voltage setting module configured to selectively set the reference voltage to a value between two adjacent ones of the K voltages or one of the two adjacent ones of the K voltages;
    a sensing module configured to sense currents through the memory cells when each of the K voltages is applied to the memory cells; and
    a counting module configured to count, based on the currents, numbers of the memory cells having threshold voltages between pairs of the K voltages, wherein the pairs include adjacent ones of the K voltages,
    wherein the reference voltage setting module selects one of the pairs having a smallest of the numbers and sets the reference voltage to the value between or equal to one of the two adjacent ones of the K voltages corresponding to the one of the pairs.

2. The system of claim 1, wherein:
    the reference voltage is one of $(2^N-1)$ reference voltages when the memory cells include flash memory cells that store N-bits each, where N is an integer greater than or equal to 1; and
    the reference voltage is determined independently of others of the $(2^N-1)$ reference voltages.

3. The system of claim 1 further comprising:
    a threshold voltage module configured to determine threshold voltages of the memory cells based on the currents; and
    a read module configured to read data stored in the memory cells by comparing the threshold voltages to the value of the reference voltage.

4. The system of claim 1, wherein:
    the counting module is configured to generate average counts for the pairs by averaging the numbers counted for a plurality of the pairs; and
    the reference voltage setting module selects one of the pairs having a smallest of the average counts and sets the reference voltage to the value between or equal to one of the two adjacent ones of the K voltages corresponding to the one of the pairs having the smallest of the average counts.

5. The system of claim 1, wherein the counting module generates first and second counts of the memory cells having threshold voltages less than $i^{th}$ and $(i+1)^{th}$ of the K voltages when the $i^{th}$ and $(i+1)^{th}$ of the K voltages are applied to the memory cells, respectively, and generates one of the numbers based on a difference between the first and second counts, where i is an integer greater than 0.

6. The system of claim 1 further comprising a reference voltage module configured to select the reference voltage from $(2^N-1)$ reference voltages when the memory cells store N-bits each, where N is an integer greater than or equal to 1, to select values of the K for the $(2^N-1)$ reference voltages, and to select predetermined values for others of the $(2^N-1)$ reference voltages when determining the reference voltage.

7. The system of claim 1 further comprising an optimization module configured to determine when to optimize the reference voltage based on one of:
    a number of erase/program cycles performed on the memory cells;
    a number of read errors detected over a period of time when reading the memory cells; and
    a period of time elapsed since a prior optimization of the reference voltage.

8. A memory integrated circuit (IC) comprising the system of claim 1 and further comprising a memory array including the memory cells.

9. A system comprising:
    a voltage generator configured to generate K voltages to be applied to memory cells, wherein the K voltages are used to determine a reference voltage used to read the memory cells, where K is an integer greater than 1;
    a reference voltage setting module configured to selectively set the reference voltage to a value between two adjacent ones of the K voltages or one of the two adjacent ones of the K voltages;
    a sensing module configured to sense currents through the memory cells when each of the K voltages is applied to the memory cells; and
    a counting module configured to count, based on the currents, numbers of 1's or 0's detected for pairs of the K voltages, wherein the pairs include adjacent ones of the K voltages,
    wherein the reference voltage setting module selects one of the pairs having a smallest of the numbers and sets the reference voltage to the value between or equal to one of the two adjacent ones of the K voltages corresponding to the one of the pairs.

10. The system of claim 9, wherein the counting modules generates first and second counts of the 1's or 0's when the $i^{th}$ and $(i+1)^{th}$ of the K voltages are applied to the memory cells, respectively, and generates one of the numbers based on a difference between the first and second counts, where i is an integer greater than 0.

11. The system of claim 9, wherein when the memory cells store 3-bits each, the reference voltage is one of seven reference voltages, and when Gray mapping is used to map states of the memory cells, the system further comprising a selector module configured to select:
    a most significant bit (MSB) page comprising MSB's of the memory cells when the reference voltage being determined is fourth of the seven reference voltages;
    a least significant bit (LSB) page comprising LSB's of the memory cells when the reference voltage being determined is one of first, third, fifth, and seventh of the seven reference voltages; and
    a central significant bit (CSB) page comprising CSB's of the memory cells when the reference voltage being determined is one of second and sixth of the seven reference voltages.

12. A method comprising:
    generating K voltages to be applied to memory cells, wherein the K voltages are used to determine a reference voltage used to read the memory cells, where K is an integer greater than 1;
    selectively setting the reference voltage to a value between two adjacent ones of the K voltages or one of the two adjacent ones of the K voltages;

sensing currents through the memory cells when each of the K voltages is applied to the memory cells;

counting, based on the currents, numbers of the memory cells having threshold voltages between pairs of the K voltages, wherein the pairs include adjacent ones of the K voltages;

selecting one of the pairs having a smallest of the numbers; and setting the reference voltage to the value between or equal to one of the two adjacent ones of the K voltages corresponding to the one of the pairs.

13. The method of claim 12, further comprising:

generating average counts for the pairs by averaging the numbers counted for a plurality of the pairs;

selecting one of the pairs having a smallest of the average counts; and setting the reference voltage to the value between or equal to one of the two adjacent ones of the K voltages corresponding to the one of the pairs having the smallest of the average counts.

14. The method of claim 12 further comprising determining when to optimize the reference voltage based on one of:

a number of erase/program cycles performed on the memory cells;

a number of read errors detected over a period of time when reading the memory cells; and a period of time elapsed since a prior optimization of the reference voltage.

15. A method comprising:

generating K voltages to be applied to memory cells, wherein the K voltages are used to determine a reference voltage used to read the memory cells, where K is an integer greater than 1;

selectively setting the reference voltage to a value between two adjacent ones of the K voltages or one of the two adjacent ones of the K voltages;

sensing currents through the memory cells when each of the K voltages is applied to the memory cells;

counting, based on the currents, numbers of 1's or 0's detected for pairs of the K voltages, wherein the pairs include adjacent ones of the K voltages;

selecting one of the pairs having a smallest of the numbers; and setting the reference voltage to the value between or equal to one of the two adjacent ones of the K voltages corresponding to the one of the pairs.

16. The method of claim 15, wherein when the memory cells store 3-bits each, the reference voltage is one of seven reference voltages, and when Gray mapping is used to map states of the memory cells, the method further comprising:

selecting a most significant bit (MSB) page comprising MSB's of the memory cells when the reference voltage being determined is fourth of the seven reference voltages;

selecting a least significant bit (LSB) page comprising LSB's of the memory cells when the reference voltage being determined is one of first, third, fifth, and seventh of the seven reference voltages; and selecting a central significant bit (CSB) page comprising CSB's of the memory cells when the reference voltage being determined is one of second and sixth of the seven reference voltages.

* * * * *